(12) United States Patent
Hori et al.

(10) Patent No.: US 6,822,334 B2
(45) Date of Patent: Nov. 23, 2004

(54) SEMICONDUCTOR DEVICE HAVING A LAYERED WIRING STRUCTURE WITH HARD MASK COVERING

(75) Inventors: Katsunobu Hori, Tokyo (JP); Nobuo Fujiwara, Tokyo (JP); Takashi Watadani, Tokyo (JP); Makoto Nagano, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 259 days.

(21) Appl. No.: 09/756,846

(22) Filed: Jan. 10, 2001

(65) Prior Publication Data

US 2002/0014695 A1 Feb. 7, 2002

(30) Foreign Application Priority Data

May 30, 2000 (JP) ........................................ 2000-160254

(51) Int. Cl.⁷ ........................... H01L 23/48; H01L 23/52
(52) U.S. Cl. ....................................... 257/775; 257/773
(58) Field of Search ................................. 257/207, 208, 257/211, 758, 773, 775, 776; 438/128, 129, 280, 618, 619, 638, 666

(56) References Cited

U.S. PATENT DOCUMENTS

| 5,346,587 A | * | 9/1994 | Doan et al. ................... 438/585 |
| 5,420,462 A | * | 5/1995 | Sudo ........................... 257/775 |
| 6,087,269 A | * | 7/2000 | Williams ..................... 438/709 |
| 6,396,727 B1 | * | 5/2002 | Schoenfeld et al. ......... 365/161 |
| 6,399,515 B1 | * | 6/2002 | Tao et al. .................... 438/714 |

FOREIGN PATENT DOCUMENTS

| JP | 02-264432 | 10/1990 |
| JP | 4-372133 | 12/1992 |

* cited by examiner

*Primary Examiner*—Hung Vu
(74) *Attorney, Agent, or Firm*—McDermott Will & Emery LLP

(57) ABSTRACT

A hard mask material 2 such as a silicon oxide film is formed on an aluminum alloy film 3. The hard mask material 2 is patterned in the form of a thick film wiring 6, followed by etching the aluminum alloy film 3 to a given depth through the mask. A resist 5 applied to the thin film portion of the aluminum alloy film 3 is patterned in the form of a thin film wiring 7. Etching through the resist 5 and the hard mask material 2 as a mask is effected to form the thick film wiring 6 and the thin film wiring 7 in the same layer.

6 Claims, 9 Drawing Sheets

SEMICONDUCTOR DEVICE HAVING A LAYERED WIRING STRUCTURE WITH HARD MASK COVERING

BACKGROUND OF THE INVENTION

1. Field of the Invention

The present invention relates to a semiconductor device, and more particularly to a semiconductor device having a layered wiring structure.

2. Description of the Background Art

For the wirings of a power supply for a semiconductor device, it is usual to give a large wiring width in order to enhance a noise resistance. On the other hand, if a large wiring width is provided for signal wirings of a semiconductor device, the lowering of a switching speed take places owing to the increase in wiring capacitance, along with an increasing layout area. To avoid this, it is desirable that the width of signal wirings be minimized within a range where a required wiring resistance is satisfied and migration can be appropriately prevented.

As for the signal wirings, there is the tendency toward the formation of a finer wiring and a thinner film owing to the development of a high integration technique or a microfabrication technique. In contrast, with respect to the wirings for power supply, a difficulty is involved in ensuring more microfabrication while keeping a required performance. Hence, it becomes necessary in recent years to form a wiring for signal and a wiring for power supply in separate layers. This is one of factors standing in the way of the microfabrication of a semiconductor device and the reduction in cost.

As a technique of solving the above-stated problems, there are known a manufacturing method disclosed, for example, in Japanese Patent Laid-open No. Hei 2-264432 (hereinafter referred to as "first prior art method") and a manufacturing method disclosed in Japanese Patent Laid-open No. Hei 4-372133 (hereinafter referred to as "second prior art method").

FIGS. 8A through 8D are sectional views for illustrating the first prior art method. In these Figures, indicated at 111 is a semiconductor substrate, at 112 is an interlayer film, at 113 is a metal wiring material, at 114 is a first resist and at 115 is a second resist.

In the first prior art method, the metal wiring material 113 is deposited on the interlayer film 112 in a film thickness of a thick film wiring as is particularly shown in FIG. 8A.

Next, as shown in FIG. 8B, the first resist 114 is formed to cover only a portion where a thick film wiring is to be formed. The exposed portion of the metal wiring material 113 is etched by anisotropic etching through the first resist 114 as a mask to a given film thickness, particularly, to a film thickness to be given to a thin film wiring.

Next, as shown in FIG. 8C, the second resist 115 is formed on the metal wiring material 113 so as to cover sites where a thick film wiring is to be formed and where a thin film wiring is to be formed. Then, anisotropic etching is again performed through the second resist 115 as a mask.

As shown in FIG. 8D, the second resist 115 is removed from the metal wiring material 113 to form the thick film wiring and the thin film wiring. Thus, according to the first prior art method, two types of wirings having significantly different film thicknesses can be formed in the same layer.

FIG. 9 shows sectional views illustrating the second prior art method. In FIG. 9, indicated by 201 is a semiconductor substrate, 202 is an inter-layer insulating film, 203 is an aluminum layer, 204 is a resist for the formation of a thick film wiring, 205 is a resist for the formation of a thin film wiring, 206 is a thin film wiring, and 207 is a thick film wiring.

In the second prior art method, the aluminum layer 203 is first deposited on the inter-layer insulating film 202 by sputtering in a thickness of 2 to 3 $\mu$m as shown in FIG. 9A. Then, the resist 204 for thick film wiring is formed on the aluminum layer 203.

As shown in FIG. 9B, anisotropic etching is effected through a mask of the resist 204 to make the film thickness of the aluminum layer 203 at approximately 1 $\mu$m. Thereafter, the resist 204 is thermally shrunk for curing.

As shown in FIG. 9C, the resist 205 for thin film wiring is formed so as to cover the surface of the thermally shrunk resist 204 and the surface of the aluminum layer 203.

Next, as shown in FIG. 9D, the reticle having a pattern for thin film wiring is used to pattern the resist 205. The resist 204 for thick film wiring leaves on the aluminum layer 203 after development of the resist 205 since being cured.

Next, as shown in FIG. 9E, the aluminum layer 203 is etched according to anisotropic etching wherein the resists 204 and 205 are used as a mask. The resists 204, 205 are removed according to a plasma method after completion of the etching. As a consequence, there are formed, in the same layer, the thick film wiring 207 having a large wiring width and film thickness and the thin film wiring 206 having a small wiring width and film thickness. In this way, according to the second prior art method, there can be formed, in the same layer, two types of wirings having different film thicknesses, respectively.

However, in the above-stated first prior art method, it becomes necessary to form the second resist on the metal wiring material 113 after patterning the thick film wiring halfway using the first resist 114 as a mask. In this case, it is very difficult to form the second resist 115 on the site where the thin film wiring is to be formed, i.e. on the site which is patterned halfway, in high precision. Accordingly, the first prior art method has the problem that it does not stably proceed at the time of mass-production.

On the other hand, the second prior art method involves a change in shape of the resist 204 prior to and after the thermal shrinkage. This makes it difficult to form the thick film wiring in high precision according to the second prior art method. Moreover, it is difficult to completely remove the resist 204 cured by thermal shrinkage by the plasma method. Accordingly, the second prior art method has the problem that a residue is liable to occur on the thick film wiring 207.

SUMMARY OF THE INVENTION

The invention has been accomplished in order to solve such problems as set out above and has for its object the provision of a semiconductor device, which has plural types of wirings having different thicknesses from one another in one layer and which is excellent in mass-production stability and has such a structure that is unlikely to cause a residue to be left on the wirings.

The above objects of the present invention are achieved by a semiconductor device described below. The semiconductor device includes a thick film wiring having a first film thickness as well as a thin film wiring having a second film thickness that is smaller than the first film thickness. The thick film wiring and the thin film wiring are formed in a single layer. The surface of the thick film is covered with a hard mask. The hard mask is resistant to etching adapted for patterning of the thick film wiring and also to etching adapted for patterning of the thin film wiring, while being resistant to heat.

The above objects of the present invention are also achieved by a semiconductor device described below. The semiconductor device includes a thick film wiring having a first film thickness as well as a thin film wiring having a second film thickness that is smaller than the first film thickness. The thick film wiring and the thin film wiring are formed in a single layer. A metallic anti-reflective film covers the surface of the thin film wiring.

The above objects of the present invention are further achieved by a semiconductor device described below. The semiconductor includes a thick film wiring having a first film thickness as well as a thin film wiring having a second film thickness that is smaller than the first film thickness. The thick film wiring and the thin film wiring are formed in a single layer. The semiconductor device also includes an inter-layer insulating film surrounding the thick film wiring and covering the thin film wiring. The thick film wiring also serves as a plug which functions as a plug capable of connection with a wiring layer formed as an upper layer on the inter-layer insulating film.

Other objects and further features of the present invention will be apparent from the following detailed description when read in conjunction with the accompanying drawings.

DESCRIPTION OF THE PREFERRED EMBODIMENTS

Figure 1A:
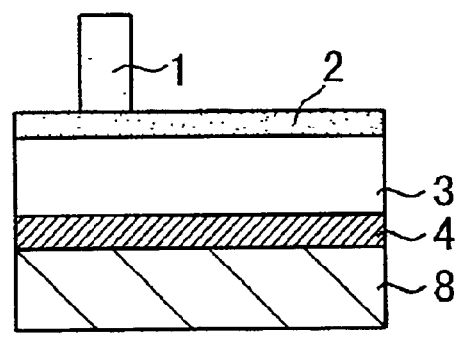
FIGS. 1A through 1F are sectional views illustrating a manufacturing method according to a first embodiment of the present invention.

In the following, principles and embodiments of the present invention will be described with reference to the accompanying drawings. The members and steps that are common to some of the drawings are given the same reference numerals and redundant descriptions therefor may be omitted.

First Embodiment

FIG. 1 shows sectional views illustrating a manufacturing method according to first embodiment of the invention. In FIG. 1, indicated at 1 is a first resist for thick film wiring, at 2 is a hard mask material, at 3 is an aluminum alloy film, at 4 is an insulating film, at 5 is a second resist for thin film wiring, at 6 is a thick film wiring, at 7 is a thin film wiring, and at 8 is a semiconductor substrate.

In the manufacturing method of this embodiment, the insulating film 4 is initially formed on the semiconductor substrate 8 as shown in FIG. 1A, on which the aluminum alloy film 3 is formed according to a sputtering method. Thereafter, a film (hereinafter referred to as "hard mask material 2"), which is unlikely to be removed during the course of etching of the aluminum alloy and is excellent in heat resistance, e.g., a silicon oxide film ($SiO_2$ film) is deposited on the aluminum alloy film 3. The first resist 1 is patterned on the hard mask material 2 so as to cover a site where a thick film wiring is to be formed.

In this embodiment, the aluminum film 3 is formed in a thickness of 1 $\mu$m, and the hard mask material 2 is formed in a thickness of 0.3 $\mu$m although these values are not critical and may be appropriately changed, respectively. Additionally, in the embodiment, the silicon oxide film is used as the hard mask material 2, which may be formed of a silicon nitride film or a tungsten film.

Figure 1B:
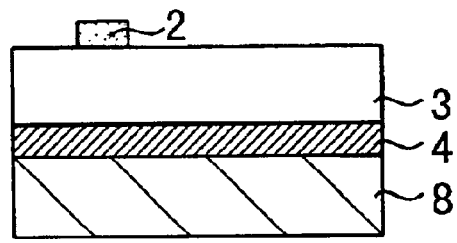

Next, anisotropic etching is performed using the first resist 1 as a mask, thereby patterning the hard mask material 2 in the form of a thick film wiring as shown in FIG. 1B. After completion of the etching of the hard mask material 2, the first resist 1 is removed by the plasma method. The removal of the resist film by the plasma method is carried out at a treating temperature of 400° C. or below. The heat resistance of the hard mask material 2 may be at a level sufficient to withstand the above mentioned treating temperature. Accordingly, any materials, which have a heat resistance against the temperature of 400° C. and has a satisfactory etching resistance, maybe usually utilized as the hard mask material 2.

Figure 1C:
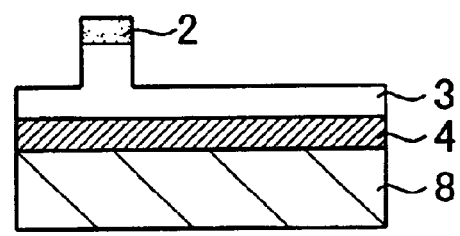

As shown in FIG. 1C, the aluminum alloy film 3 is anisotropically etched in the surface thereof through the mask of the hard mask material 2 patterned in the form of the thick film wiring. The anisotropic etching is carried out such that the thickness of the aluminum alloy film 3 is at about 0.4 $\mu$m at the portion where not covered with the hard mask material 2.

Figure 1D:
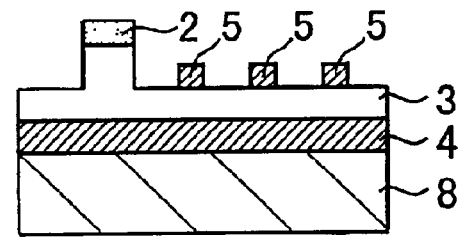

Next, as shown in FIG. 1D, the second resist 5 is so patterned on the aluminum alloy film 3 as to cover a site where the thin film wiring is to be formed.

Figure 1E:
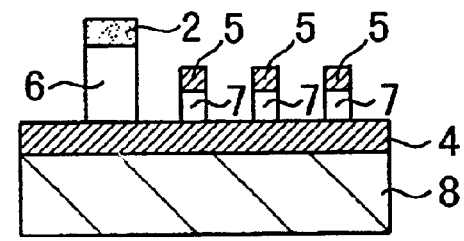

As shown in FIG. 1E, the aluminum alloy film 3 is anisotropically etched through the hard mask material 2 and the second resist 5.

Figure 1F:
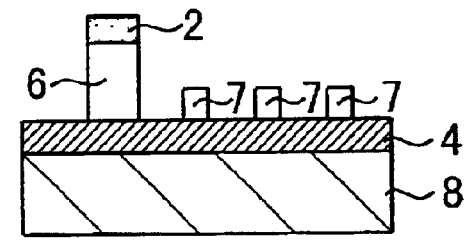

As shown in FIG. 1F, the second resist 5 is removed by the plasma method after completion of the anisotropic etching. As a result, the thick film wiring 6 covered with the hard mask material and the thin film wiring 7 are formed. It is to be noted that because the hard mask material 2 does not adversely influence the characteristic properties of the thick film wiring 6, it is not necessary to remove it from above the thick film wiring 6.

As stated above, according to the manufacturing method of this embodiment, the thick film wiring for power supply and the thin film wiring for signals can be laid in one layer while overcoming the problems of the first and second prior art methods. More particularly, according to the manufacturing method of this embodiment, a semiconductor device, which is provided with plural types of wirings having different film thicknesses and wiring widths in high density, can be stably mass-produced without causing a residue on the wirings.

Second Embodiment

Figure 2A:
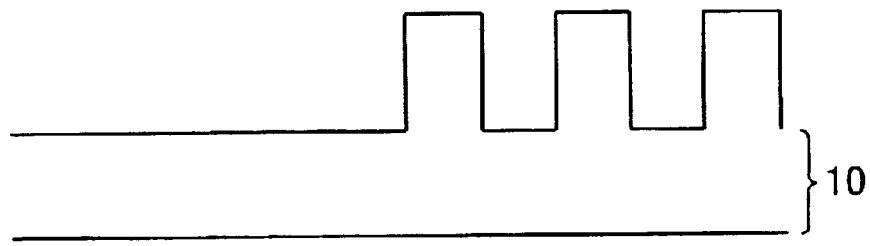
FIGS. 2A through 2C are sectional views illustrating a manufacturing method according to a second embodiment of the present invention.
Figure 2B:
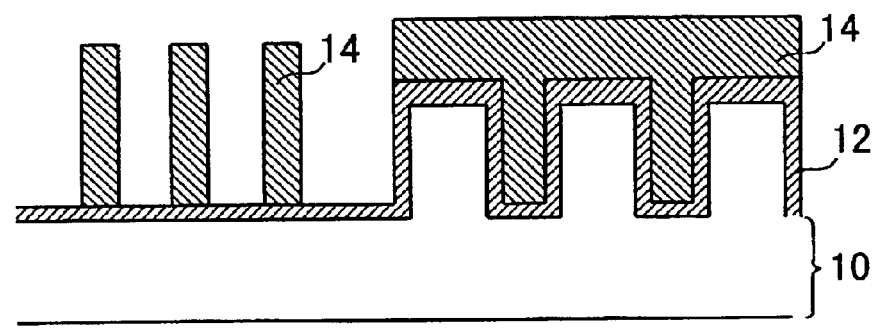
Figure 2C:
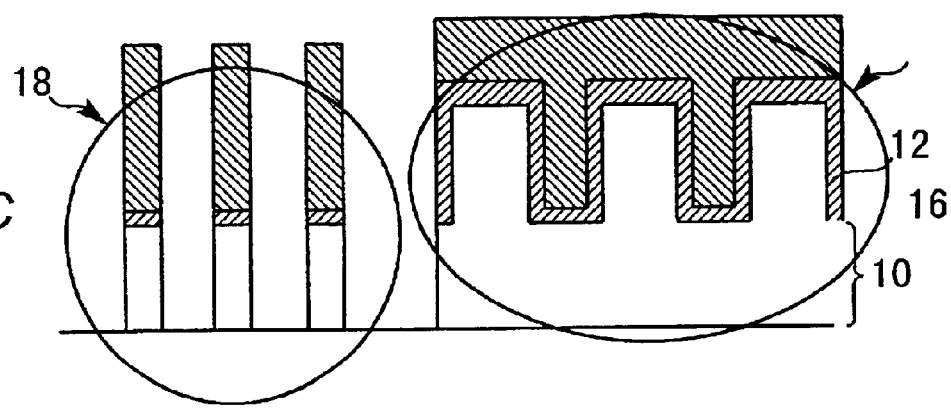

Second embodiment of the present invention is now described with reference to FIGS. 2A through 2C. FIGS. 2A through 2C are sectional views illustrating a manufacturing method according to the second embodiment of the present invention. In these Figures, indicated 10 is a metal film, at 12 is an anti-reflective film, at 14 is a resist, at 16 is a first wiring, and at 18 is a second wiring.

In the manufacturing method of this embodiment, the metal film 10 is first deposited on a semiconductor substrate or the like in a film thickness corresponding to that of the first wiring 16. The metal film 10 is constituted, for example, of a layered film made of TiN, AlCu and TiN, or a layered film made of TiN, W and TiN. The TiN, which is formed as an upper layer of AlCu or W, serves as an anti-reflective film. The TiN, which is formed as a lower layer of AlCu or W, serves as a barrier metal. It will be noted that the metal film 10 may be a single-layer film of Al or W. The metal film 10 is in such a state as shown in FIG. 2A, by etching through the silicon oxide film or silicon nitride film as a mask.

When the first etching as stated above has been completed, the anti-reflective film 12 is formed on the metal film 10 as shown in FIG. 2B. The anti-reflective film 12 is constituted, for example, of a TiN film. The resist 14 is deposited on the anti-reflective film 12. The resist 14 is so patterned according to a photolithographic technique as to cover a site where the first wiring 16 is to be formed and a site where the second wiring 18 is to be formed. In this embodiment, since the anti-reflective film 12 is formed on the metal film 10, the resist can be patterned in high precision.

The metal film 10 is etched through the mask of the resist 14 along with the anti-reflective film 12. As a consequence, as shown in FIG. 2C, the first wiring 16 and the second wiring 18, which are different in height from each other, can be formed in the same layer in high precision. In this case, the resist 14 has a uniform film thickness and can be formed on the anti-reflective film 12 having a uniform thickness.

Hence, according to the manufacturing method of this embodiment, the second etching can be performed in high precision, thereby forming the fine second wiring 18 in high precision.

In the manufacturing method of this embodiment, the first wiring 16 is constituted of the protruded portion formed by the first etching and the flattened portion formed by the second etching. As shown in FIG. 2C, the protruded portion has such a layout that the region occupied thereby is made smaller than that of the flattened portion. Thus, in this embodiment, the resist 14 can be readily patterned in the form of the first wiring 16 (i.e. the form of the flattened portion). Moreover, according to the embodiment, the thermal shrinkage of the resists is not necessary during the course of the formation of the wirings having different heights. Hence, the manufacturing method of this embodiment overcomes the problems involved in both the first prior art method and the second prior art method.

Third Embodiment

Third embodiment of the present invention is illustrated with reference to FIGS. 3A through 3D. FIGS. 3A through 3D are sectional views illustrating the manufacturing method of a third embodiment. In these Figures, indicated at 20 is a first resist serving as a mask in the course of first etching, and at 22 is a first anti-reflective film for patterning the first resist in high precision. The first anti-reflective film 22 is constituted, for example, of TiN.

In FIGS. 3A through 3D, indicated at 24 is a first metal film constituted of AlCu or W, at 26 is a second anti-reflective film constituted, for example, of TiN, at 28 is a second metal film constituted of AlCu or W, at 29 is a barrier metal constituted of TiN or the like, at 30 is a second resist serving as a mask for second etching, at 32 is a first wiring, and at 34 is a second wiring. In this embodiment, the second anti-reflective film 26 functions not only as a stopper film in the course of the first etching, but also as an anti-reflective film for pattering the second resist 30 in high precision.

Figure 3A:
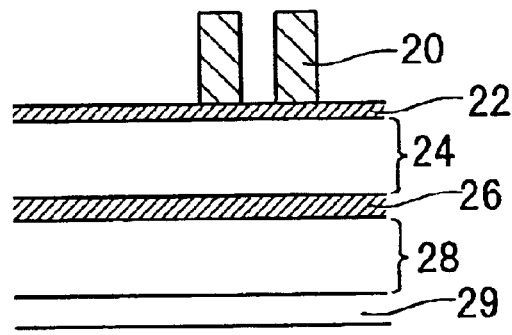
FIGS. 3A through 3D are sectional views illustrating a manufacturing method according to a third embodiment of the present invention.

In the manufacturing method of this embodiment, as shown in FIG. 3A, the barrier metal 29, the second metal film 28, the second anti-reflective film 26, the first metal film 24 and the first anti-reflective film 22 are formed on a semiconductor substrate in this order. The first resist 22 is formed on the first anti-reflective film 22 so as to cover only a site, which should be left as part of the first wiring 32.

Figure 3B:
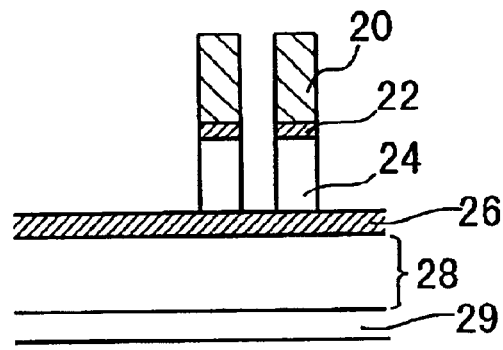

As shown in FIG. 3B, first etching is carried out using the first resist 20 as a mask until the second anti-reflective film 26 is exposed. This etching is started with Cl-based dry etching if the first metal film 24 consists of AlCu. The conditions are changed at the stage of completing the removal of AlCu so that AlCu is removable at a high selection ratio relative to TiN. On the other hand, when the first metal film 24 consists of W, the etching is carried out by F-based drying etching wherein W is removable at a high selection ratio relative to TiN. Since the first etching is performed under such conditions as mentioned above, the second anti-reflective film (TiN) effectively functions as a stopper film.

Figure 3C:
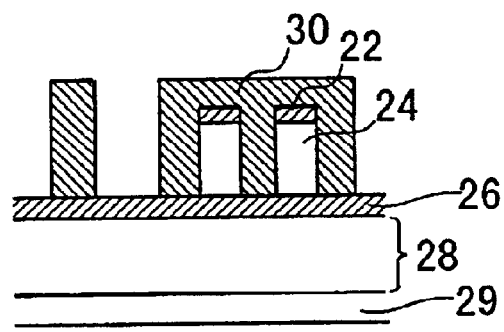

As shown in FIG. 3C, the second resist 30 is patterned on the second anti-reflective film 26 so as to cover both sites where the first wiring 32 is to be formed and the second wiring 34 is to be formed. During the patterning, halation as is caused by photolithography can be effectively prevented by means of the second anti-reflective film 26, thereby ensuring high precision patterning of the second resist 30.

Figure 3D:
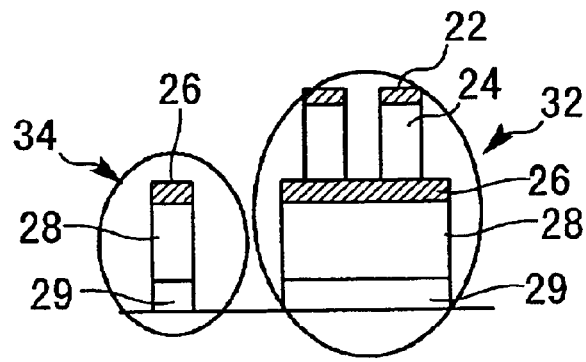

Next, in order to subject the second anti-reflective film 26, the second metal film 28 and the barrier metal 29 to patterning through the mask of the second resist 30, the second etching is carried out. As a result, as shown in FIG. 3D, there can be formed, in the same layer, the first wiring 32 and the second wiring 34 having different altitudes.

As set forth above, according to the manufacturing method of this embodiment, the second resist 30 can be patterned on the second anti-reflective film 26. This permit the second etching to be carried out in high precision according to the manufacturing method of the present embodiment, thereby forming the fine second wiring 34 in high precision. Moreover, in this embodiment, the second anti-reflective film 26 has been preliminarily sandwiched between the first and second metal films 24, 28, so that it is not necessary to form an anti-reflective film after the first etching. Thus, the manufacturing method of this embodiment can be performed in a simpler procedure than the second embodiment.

By the way, in the manufacturing method of this embodiment, the first wiring 32 is constituted of the protruded portion formed by the first etching, and the flattened portion formed by the second etching. As shown in FIG. 3D, the protruded portion has such a layout that the region occupied thereby is smaller than that of the flattened portion. This enables one to readily pattern the second resist 30 in the form of the first wiring 32, i.e., in the form of the flattened portions. Moreover, in this embodiment, it is unnecessary to subject the resist to thermal shrinkage in the course of the formation of the wiring having different altitudes. Thus, according to the manufacturing method of the embodiment, the problems involved in both the first prior art method and the second prior art method can be overcome.

Fourth Embodiment

Fourth embodiment of the invention is now described with reference to FIGS. 4A through 4D and 5A through 5D. These Figures, respectively, show a sectional view illustrating the manufacturing method according to fourth embodiment of the present invention.

Figure 4A:
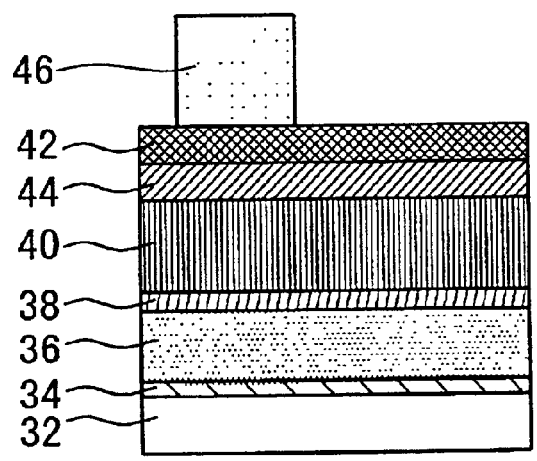
FIGS. 4A through 4D and 5A through 5D are sectional views illustrating a manufacturing method according to a fourth embodiment of the present invention.
Figure 4B:
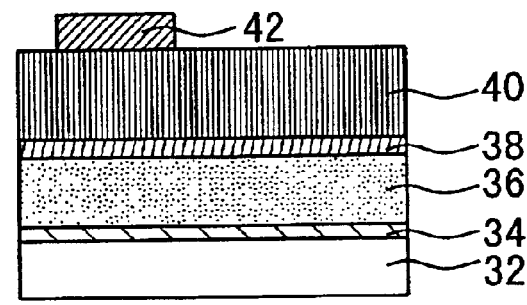

In the manufacturing method of this embodiment, a first inter-layer insulating film 32 is formed such as on a semiconductor substrate according to a plasma CVD method as shown in FIG. 4A. A first diffusion preventing metal film 34 is formed on the first inter-layer insulating film 32 according to a sputtering method. The first diffusion preventing metal film 34 is constituted of an about 30 nm thick Ti film and an about 50 nm thick TiN film formed thereon.

An AlCu film 36 having a Cu content of 0.5% is formed on the first diffusion preventing metal film 34 in a thickness of about 500 nm according to a sputtering method. A second diffusion preventing metal film 38 having the same constitution as the first diffusion preventing metal film 34 is further formed on the AlCu film 36 by a sputtering method. An about 500 nm thick W film 40 is formed on the second diffusion preventing metal film 38 by a low pressure CVD method. A 200 nm thick SiN film 42 is formed on the W film 40 according to a plasma CVD method. Moreover, an about 100 nm thick anti-reflective organic compound film 44 is formed on the SiN film 42. A first resist 46 is applied onto the anti-reflective organic compound film 44. The first resist 46 is patterned in a desired form.

The anti-reflective organic compound film 44 and the SiN film 42 are, respectively, etched according to a reactive ion etching method (RIE method) using the first resist 46 as a mask. After completion of the etching, the first resist 46 is removed by an oxygen plasma removal method. Moreover, the anti-reflective organic compound film 44 left on the SiN film 42 is removed by means of an organic stripping agent. As a consequence, there is formed the structure shown in FIG. 4B.

Figure 4C:
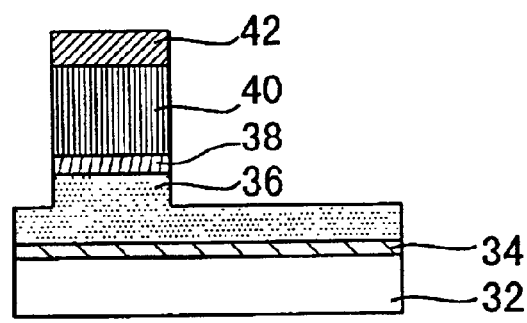

The W film 40 and the second diffusion preventing metal film 38 are, respectively, etched according to the RIE method using the above-patterned SiN film 42 as a mask. Next, the AlCu film 36 is anisotropically etched to part of its full thickness, particularly, to such a level that the film thickness is made at 250 nm. The corrosion preventing treatment of the AlCu film 36 is carried out to make such a state as shown in FIG. 4C.

Figure 4D:
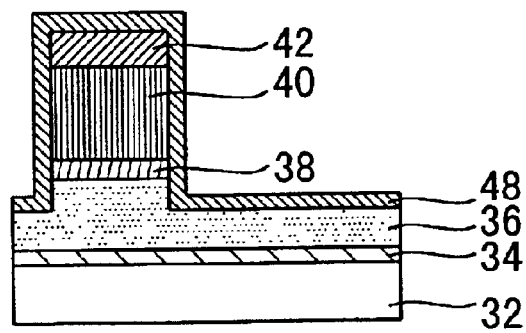

As shown in FIG. 4D, an anti-reflective metal film 48 is formed to wholly cover the surfaces such as of the AlCu film and the like. The anti-reflective metal film 48 is constituted of an about 30 nm thick Ti film and an about 50 nm thick TiN film formed thereon.

Figure 5A:
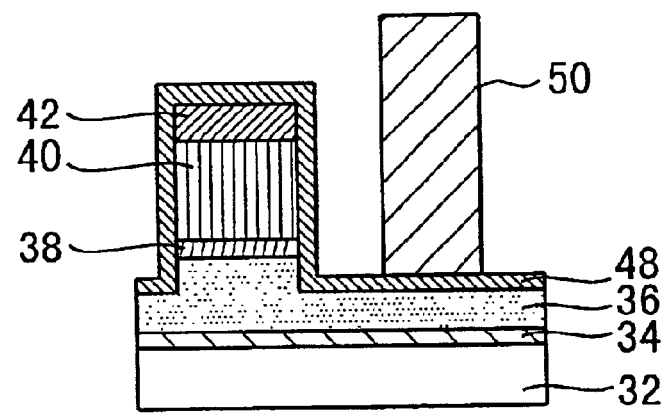

Next, as shown in FIG. 5A, a second resist 50 is applied onto the AlCu film 36 whose thickness has been made at about 250 nm through the anti-reflective metal film 48. The second resist 50 is patterned in the form of a thin film wiring that is to be formed on the semiconductor substrate. The second resist 50 is patterned in high precision because of its formation on the anti-reflective metal film 48.

Figure 5B:
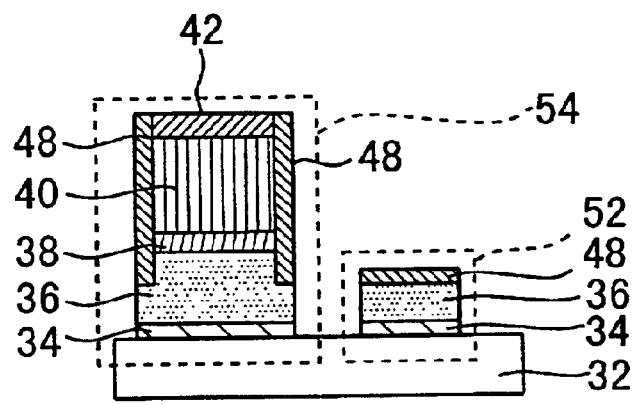

As shown in FIG. 5B, the anti-reflective film 48, the AlCu film 36 and the first diffusion preventing metal film 34 are, respectively, anisotropically etched according to the RIE method using the second resist 50 as a mask. A known corrosion preventing treatment is performed, thereby forming a thin film wiring 52 made of the anti-reflective metal film 48, the AlCu film 36 and the first anti-reflective metal film 34. During the formation of the thin film wiring 52, the anti-reflective film 48 covering the SiN film 42 is removed, thereby forming a thick film wiring 54 having the SiN film 42 as an uppermost layer.

Figure 5C:
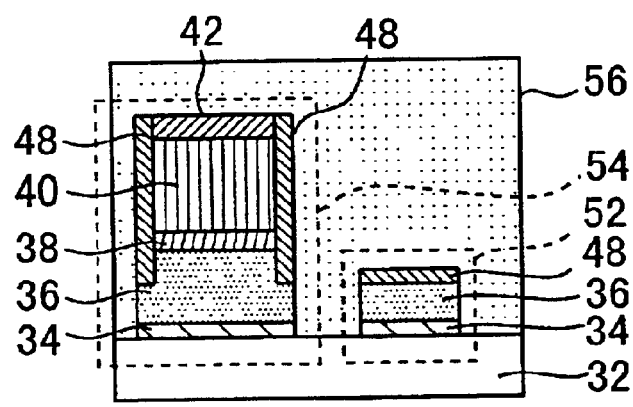

Next, as shown in FIG. 5C, a second inter-layer insulating film 56 is deposited over the first insulating layer film 32 so as to cover both thin film wiring 52 and thick film wiring 54.

Figure 5D:
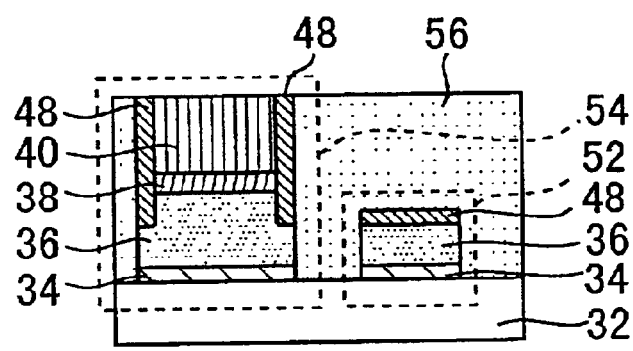

The second inter-layer insulating film 56 is polished according to the oxide film CMP method. The SiN film 42 existing as the uppermost layer of the thick film wiring 54 is removed by the CMP to form such a state where the W film 40 is exposed, as shown in FIG. 5D. As a result, the thick film wiring 54 serves as a metallic wiring acting as a plug for ensuring electric conduction between a wiring existing in the second inter-layer insulating film 56 and a wiring formed on the second inter-layer insulating film 56.

Thus, according to the manufacturing method of this embodiment, there can be formed, in the same layer, the thick film wiring 54 serving also as a plug and the thin film wiring 52 suited as a wiring for signal in high precision. In the embodiment, it is not necessary that the second resist be patterned as superposed at a portion where the thick film wiring 54 is to be formed. Moreover, the thick film wiring 54 is finally polished by CMP, not permitting any residue, such as of a resist, to be left on the surface. Accordingly, the problems involved in the afore-stated first or second prior art method can be overcome by the manufacturing method of this embodiment.

The above-stated fourth embodiment illustrates an example of a method of forming one layer in a multi-layered wiring structure, and the invention should not be construed as limiting to the above case. More particularly, when the series of steps set out above are repeated, there can be formed a multi-layered wiring structure made of a plurality of wiring layers that are mutually, electrically connected.

Fifth Embodiment

Fifth embodiment of the present invention is illustrated with reference to FIGS. 6A through 6G. FIGS. 6A through 6G are sectional views illustrating the manufacturing method of the fifth embodiment of the invention.

Figure 6A:
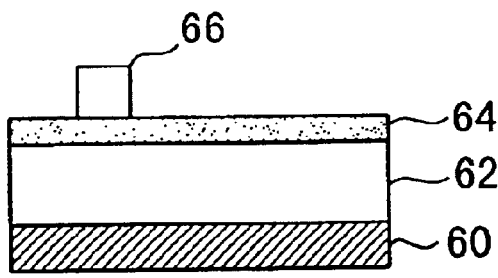
FIGS. 6A through 6G are sectional views illustrating a manufacturing method according to a fifth embodiment of the present invention.

In the manufacturing method of this embodiment, as shown in FIG. 6A, an approximately 1 $\mu$m thick aluminum film 62 is formed on a semiconductor substrate 60 by a sputtering method. An about 0.3 $\mu$m thick silicon oxide film 64 is formed on the aluminum film 62 by a plasma CVD method. It will be noted that the thicknesses of the aluminum film 62 and the silicon oxide film 64 are not limited to those values indicated above, respectively and may be appropriately changed. A first resist 66 formed as an upper layer of the silicon oxide film 64 is patterned in the form of a plug, which is utilized for connection with an upper wiring layer in future.

Figure 6B:
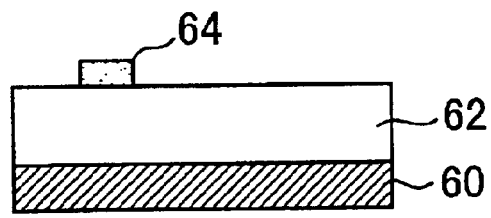

As shown in FIG. 6B, the silicon oxide film 64 is patterned by dry etching through the mask of the first resist 66. After completion of the etching, the first resist 66 is removed from the surface of the silicon oxide film 64.

Figure 6C:
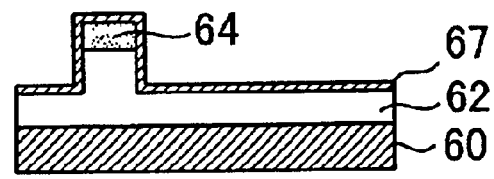

The aluminum film 62 is etched to part of its thickness, particularly, to a depth of 0.6 $\mu$m through the mask of the above-patterned silicon oxide film 64. Thereafter, as shown in FIG. 6C, an about 30 nm thick TiN film 67 is formed on the aluminum film 62 and the silicon oxide film 64 by a sputtering method. The TiN film 67 functions not only as an anti-reflective layer for preventing reflection from the underlying layer, but also to protect the upper portion of the fine aluminum pattern when a resist formed thereon is patterned in a subsequent step, thereby enhancing the reliability thereof.

Figure 6D:
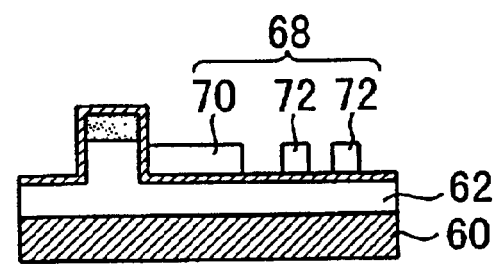
Figure 6E:
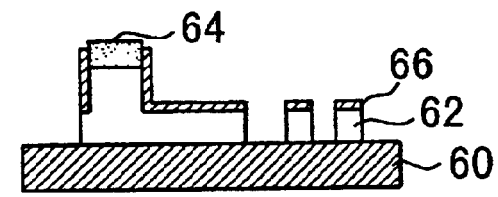

Next, as shown in FIG. 6D, a second resist 68 for forming a fine thin-film wiring is formed on the TiN film 67. In this embodiment, the second resist 68 includes a portion 70, which is formed adjoining to the protruded portion formed by the above process, and portions 72 formed at positions distant from the protruded portion. The portion of the aluminum film 62 covered with the former portion 70 serves as a wiring electrically connecting lately with an upper wiring, and the portions covered with the latter portions 72, respectively, serve as a wiring not electrically connecting with the upper wiring in future.

The aluminum film 62 and the TiN film 67 are, respectively, patterned in a desired form by anisotropic etching using the mask of the second resist 68. After completion of the etching, the second 68 is removed to form a wiring structure shown in FIG. 6E.

Figure 6F:
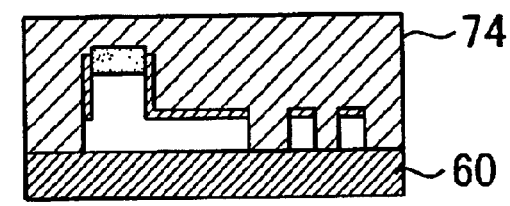

As shown in FIG. 6F, the semiconductor substrate 60 is covered on the entire surface thereof with an inter-layer insulating film 74. The inter-layer insulating film 74 should have a thickness larger than that of the remaining aluminum film 62 so as to wholly cover the film 62 therewith. In this embodiment, the inter-layer insulating film 74 is formed by depositing a 0.8 $\mu$m thick silicon oxide film according to a plasma CVD method.

Figure 6G:
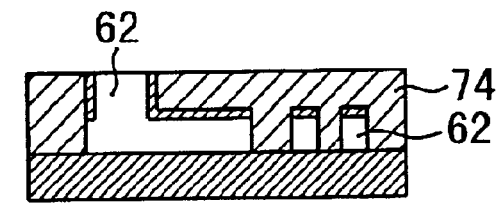

Finally, the inter-layer insulating film 74 is polished by CMP. The CMP is continued until the protruded portion of the aluminum film 62 is exposed to from the upper portion of the inter-layer insulating film 74 as shown in FIG. 6G. As a consequence, the protruded portions of the aluminum film 62 become wirings existing in the layer insulating layer film 74 and a metal wiring, which serves also as a plug electrically connecting with a wiring formed as an upper layer relative to the layer insulating layer 74.

Thus, according to the manufacturing method of this embodiment, the thick film wiring serving as a plug and fine thin film wirings suited as a wiring for signal can be formed in high precision. In this embodiment, it is not necessary to pattern the second resist 68 as superposed on a portion where the thick film wiring is to be formed. Moreover, the thick film wiring serving as a plug is finally polished by CMP, so that no residue such as a resist is not left on the surface thereof. Accordingly, the problems involved in the first or second prior art method can be overcome according to the manufacturing method of this embodiment.

The above-stated fifth embodiment illustrates an example of a method of forming one layer in a multi-layered wiring structure, and the invention should not be construed as limiting to the above case. More particularly, when the series of steps set out above are repeated, there can be formed a multi-layered wiring structure made of a plurality of wiring layers that are mutually, electrically connected.

Sixth Embodiment

Sixth embodiment of the present invention is illustrated with reference to FIGS. 7A through 7G. FIGS. 7A through 7G are sectional views illustrating the manufacturing method of the sixth embodiment of the invention. The manufacturing method of this embodiment differs from the method of the fifth embodiment in that the TiN film serving as an anti-reflective layer has been preliminarily interposed between two aluminum layers. The manufacturing method of this embodiment is described along individual steps. It will be noted that in FIGS. 7A through 7G, like portions as shown in FIGS. 6A through 6G are indicated by like reference numerals, respectively, and are not explained again.

Figure 7A:
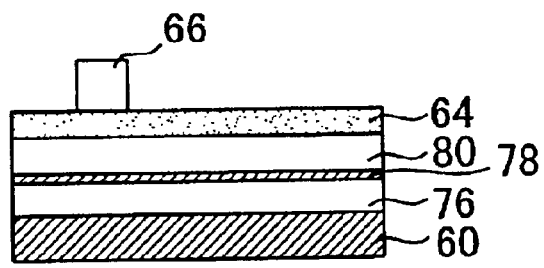
FIGS. 7A through 7G are sectional views illustrating a manufacturing method according to a sixth embodiment of the present invention.

In the manufacturing method of the embodiment, as shown in FIG. 7A, a first aluminum film 76 is formed on a semiconductor substrate 60 by a sputtering method. A TiN film 78 for anti-reflection is formed on the first aluminum film 76. A second aluminum film 80 is formed on the TiN film 78. A silicon oxide film 64 is formed on the second aluminum film 80 by a plasma CVD method. In this embodiment, the first aluminum film 76 and the second aluminum film 80, respectively, have a thickness of 0.4 $\mu$m, the TiN film 78 has a thickness of 30 nm, and the silicon oxide film 64 is formed as having a thickness of 0.3 $\mu$m.

Nevertheless, these film thicknesses are not limited to those values and may be appropriately changed. The first resist 66 on the silicon oxide film 64 is patterned in the form of a plug utilized for connection with an upper wiring layer later.

Figure 7B:
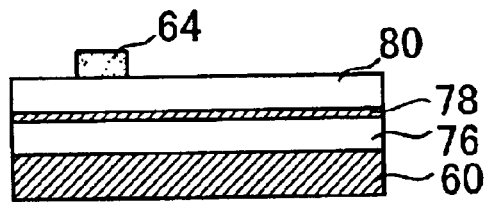

As shown in FIG. 7B, the silicon oxide film 64 is subjected to patterning by dry etching using the mask of the first resist 66. After completion of the etching, the first resist 66 is removed from the surface of the silicon oxide film 64.

Figure 7C:
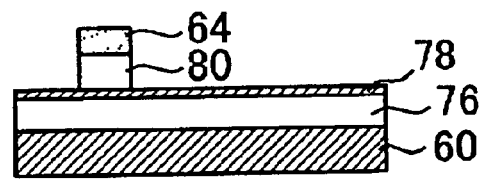

Next, as shown in FIG. 7C, the second aluminum film 80 is etched through the mask of the patterned silicon oxide film 64. The etching is carried out under such conditions that the second aluminum film 80 is removed at a high selection ratio relative to TiN. This enables the TiN film 78 to function as a stopper film in the course of the etching in this embodiment, thereby causing the depth of the etching to be uniform throughout the substrate.

Figure 7D:
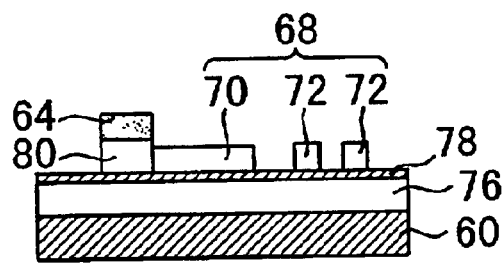
Figure 7E:
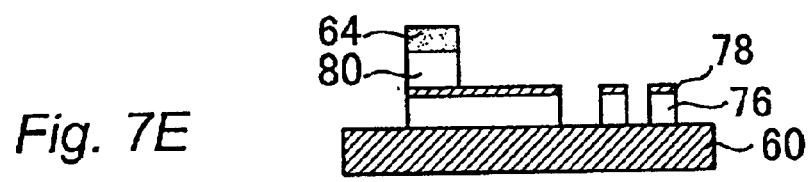
Figure 7F:
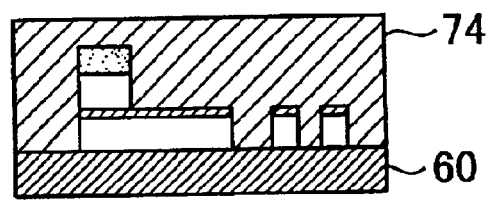
Figure 7G:
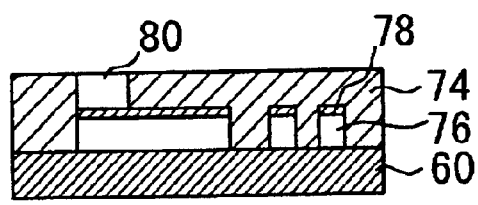
Figure 8A:
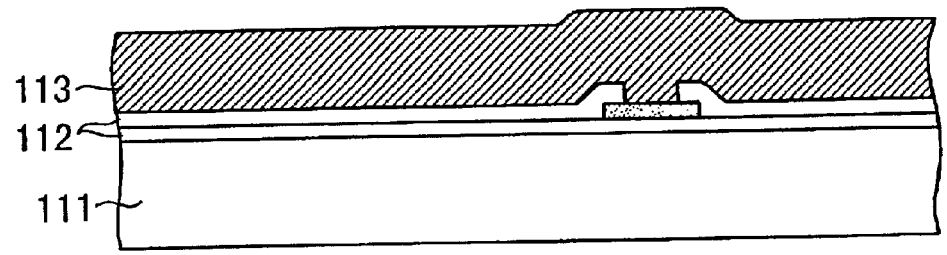
FIGS. 8A through 8D are sectional views illustrating a first prior art method of manufacturing a semiconductor device.
Figure 8B:
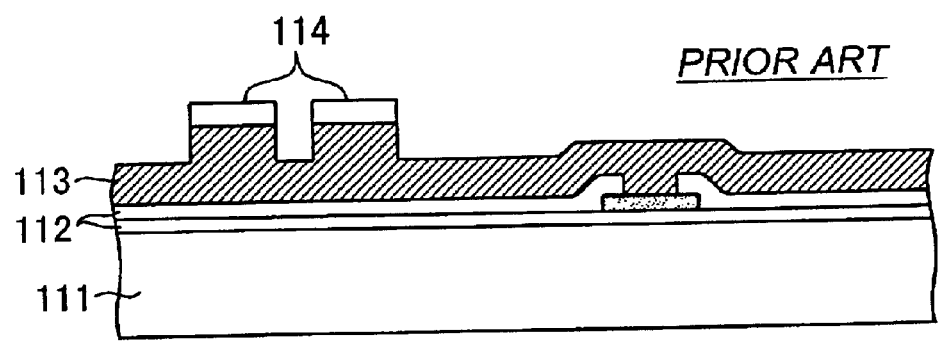
Figure 8C:
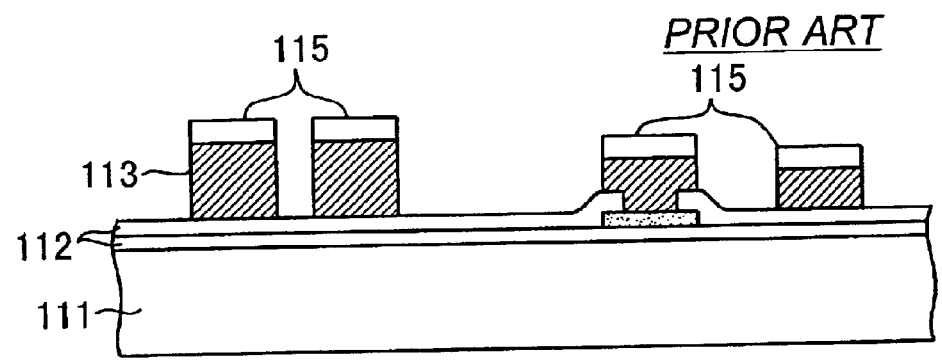
Figure 8D:
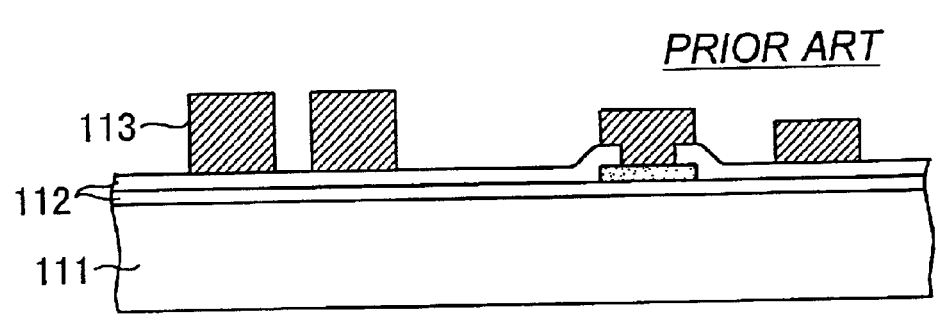
Figure 9A:
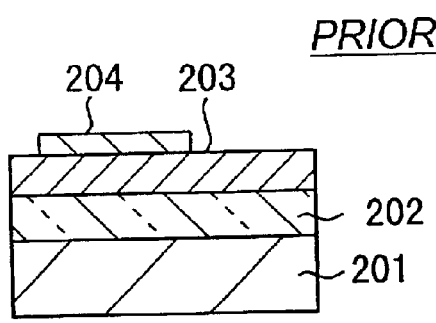
FIGS. 9A through 9E are sectional views illustrating a second prior art method of manufacturing a semiconductor device.
Figure 9B:
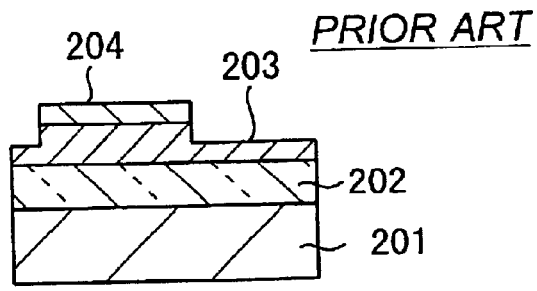
Figure 9C:
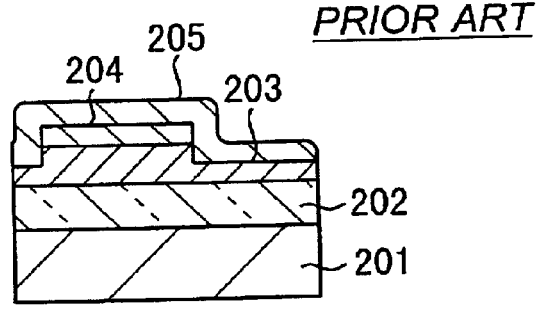
Figure 9D:
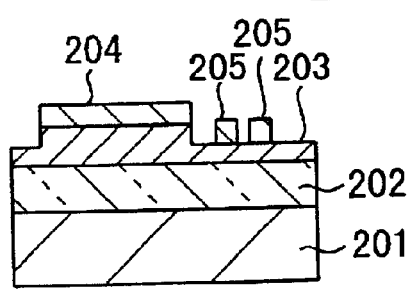
Figure 9E:
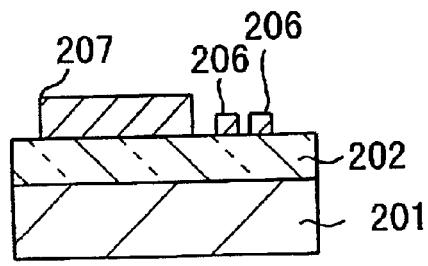

Subsequently, as shown in FIG. 7D, a second resist 68 for forming a fine thin-film wiring is formed on the TiN film 78. The second resist 68 includes, like the fifth embodiment, a portion 70 to be formed contiguously to the protruded portion formed by the above process, and portions 72 formed at positions distant from the protruded portion. The portion of the first aluminum film 76 covered with the former portion 70 acts as a wiring electrically connecting with a wiring at an upper layer in future, and the portion covered with the latter portions 72 becomes a wiring not electrically connecting with an upper wiring in future.

The TiN film 78 and the first aluminum film 76 are, respectively, patterned in a desired form by anisotropic etching through the mask of the second resist 68. After completion of the etching, the second resist 68 is removed to form a wiring structure shown in FIG. 7E.

Subsequently, the treating steps as in the fifth embodiment are carried out to form a thick film wiring serving also as a plug and fine thin-film wirings suited as a wiring for signal in high precision in the same layer. According to the manufacturing method of this embodiment, while, like the fifth embodiment, the problems involved in the afore-stated first or second prior art method can be overcome by the manufacturing method of this embodiment, the wirings having different altitudes can be formed in the same layer in high precision.

In the manufacturing method of this embodiment, the TiN film 78 can be utilized as a stopper film when etched as stated above. This does not necessitate any control in time of etching of the second aluminum film 80, and the height of the portion serving as the plug (i.e. a thickness of the remaining second aluminum film 80) and the height of the portion of the thin film wiring (i.e. the sum of the thickness of the remaining first aluminum film 80 and the thickness of the remaining TiN film 78) can be readily made uniform over the entire surface of the semiconductor substrate 60.

The above-stated sixth embodiment illustrates an example of a method of forming one layer in a multi-layered wiring structure, and the invention should not be construed as limiting to the above case. More particularly, when the series of steps set out above are repeated, there can be formed a multi-layered wiring structure made of a plurality of wiring layers that are mutually, electrically connected.

The major benefits of the present invention described above are summarized as follows:

According to a first aspect of the present invention, since a thick film wiring and a thin film wiring can be located in the same layer, so that the degree of integration of a semiconductor device can be increased. Since the thick film wiring is covered with a hard mask on the surface thereof, the shape of the thick film wiring can be determined depending on the shaped of the hard mask. Moreover, according to the invention, it is reliably prevented that the residue of a resist is left on the surface of the tick film wiring. Thus, according to the invention, there can be realized a semiconductor device having a high wiring accuracy and a stable quality.

According to a second aspect of the present invention, the protruded portion in the form of a thick film wiring can be formed on the surface of the metal material by etching the metal material to a given depth thereof by use of the hard mask. Subsequently, the metal material is etched through the mask of a resist, thereby patterning a thick film wiring and a thin film wiring in the same layer in high precision.

According to a third aspect of the present invention, the surface of the thin film wiring formed in the same layer as the thick film wiring can be covered with the anti-reflective film. Where the thick film wiring and the thin film wiring are, respectively, formed in the same layer, there is used a technique wherein the step between the thick film wiring and the thin film wiring is formed by the first etching, and both are formed by the second etching. Accordingly, in order to form the thin film wiring in high precision, it is necessary to pattern, in high precision, a resist on the metal material that has been made thin in the first etching. In the practice of the invention, it is permitted to form the anti-reflective film on the surface of a thin film material, i.e. on the surface of the metal material made thin in the first etching. Thus, according to the structure of the invention, high precision is ensured with respect to the shape of the thin film wiring.

According to a fourth aspect of the present invention, the thick film wiring can be constituted of a flattened portion and a protruded portion. Accordingly, the protruded portion is formed by the first etching, and the flattened portion is patterned by the second etching while protecting the protruded portion. The protruded portion is located within an occupying area narrower than that of the flattened portion, so that the mask for protecting the protruded portion at the time of the second etching is not required to be so high in precision. Hence, according to the invention, there can be realized a semiconductor device which has both a thick film wiring and a thin film wiring in the same layer and is stable in quality.

According to a fifth aspect of the present invention, there can be realized a thick film wiring wherein the boundary between the protruded portion and the flattened portion is made of a single metal. The anti-reflective film is formed on the surface of the thick film wiring as on the surface of the thin film wiring. Such a structure can be obtained by forming an anti-reflective film on the entire surface of the metal material after the formation of the protruded portion by the first etching, and patterning the flattened portion by the second etching. In this case, the mask used in the course of the second etching can be formed on the anti-reflective film. Thus, according to the invention, both thin film wiring and thick film wiring can be formed in high precision.

According to a sixth aspect of the present invention, there can be realized the thick film wiring wherein an anti-reflective film is interposed at the boundary between the protruded portion and the flattened portion. In this case, the anti-reflective film can be functioned as an etching stopper when the first etching is carried out. Hence, according to the invention, the thick film wiring and the thin film wiring can be formed in high precision, and the control of the conditions for their formation can be simplified.

According to a seventh aspect of the present invention, the thick film wiring and the thin film wiring can be formed in high precision according to a technique wherein after the formation of the protruded portion by subjecting the metal material to first etching, an anti-reflective film is formed thereon, followed by the second etching.

According to a ninth aspect of the present invention, the first etching is carried out while using anti-reflective film sandwiched between the films of metal materials as an etching stopper, so that the protruded portion can be readily formed. Thereafter, the resist is patterned on the anti-reflective film, under which the second etching is carried out using the resist as a mask, thereby forming the thick film wiring and the thin film wiring in high precision.

According to a tenth aspect of the present invention, there can be realized a semiconductor device, which comprises, in the same layer, a wiring for great current such as a wiring for power supply or a wiring for ground, and a wiring for small current such as a wiring for signal.

According to a eleventh aspect of the present invention, there can be realized a semiconductor device, which comprises, in the same layer, a thick film wiring functioning as a plug for connection with a wiring in an upper layer, and a thin film wiring having a film thickness smaller than the thick film wiring.

According to a twelfth aspect of the present invention, the anti-reflective film is formed on the thin film wiring. The mask for patterning the thin film wiring can be formed on the anti-reflective film. Hence, according to the invention, a high precision can be imparted to the thin film wiring.

According to a thirteenth aspect of the present invention, the first etching is effected under protection of the surface of a metal material with a hard mask, so that there can be formed the step between the thick film wiring for plug and the thin film wiring. Moreover, the second etching is effected after the formation of the anti-reflective film, thereby forming the thick film wiring for plug and the thin film wiring. Thereafter, the hard mask is removed along with an inter-layer insulating film by polishing, thereby forming desired structures in the same layer.

According to a fourteenth aspect of the present invention, there can be formed the step between the thick film and the thin film wiring by performing the first etching until the anti-reflective film is exposed while protecting the surface of a metal material with a hard mask. Further, when the second etching is effected after patterning a resist on the anti-reflective film, there can be obtained the thick film wiring for plug and the thin film wiring in a desired form. Thereafter, the hard mask is removed along with an inter-layer insulating film by polishing to obtain desired structures in the same layer.

According to a fifteenth aspect of the present invention, the protruded portion and a position adjacent thereto are masked with a resist, thereby forming a thin film wiring electrically connecting with the thick film wiring for plug.

Further, the present invention is not limited to these embodiments, but variations and modifications may be made without departing from the scope of the present invention.

The entire disclosure of Japanese Patent Application No. 2000-160254 filed on May 30, 2000 including specification, claims, drawings and summary are incorporated herein by reference in its entirety.

What is claimed is:

1. A semiconductor device comprising:

a thick film wiring having a first film thickness;

a thin film wiring having a second film thickness that is smaller than the first film thickness, said thick film wiring and said thin film wiring being formed in a single layer; and a hard mask covering only the surface of said thick film therewith;

wherein said hard mask is resistant etching adapted for patterning of said thick film wiring and also to etching adapted for patterning of said thin film wiring, while being resistant to heat.

2. The semiconductor device according to claim 1, wherein said hard mask comprises a silicon oxide film.

3. The semiconductor device according to claim 1, wherein said hard mask comprises a silicon nitride film.

4. The semiconductor device according to claim 1, wherein said hard mask comprises a tungsten film.

5. The semiconductor device according to claim 1 wherein said thick film wiring serves as a wiring for an electric supply or said semiconductor device or as a wiring for ground.

6. The semiconductor device according to claim 1, wherein the hard mask is resistant to heat at 400° C.

* * * * *